(12) United States Patent
Yoo et al.

(10) Patent No.: US 10,784,314 B2
(45) Date of Patent: Sep. 22, 2020

(54) IMAGE SENSOR INCLUDING COLOR FILTERS

(71) Applicant: SAMSUNG ELECTRONICS CO., LTD., Suwon-si, Gyeonggi-do (KR)

(72) Inventors: Jong Hyun Yoo, Hwaseong-si (KR); Eun Mi Kim, Hwaseong-si (KR); Joon Kim, Hwaseong-si (KR); Chang Hwa Kim, Hwaseong-si (KR); Sang Su Park, Hwaseong-si (KR); Kyung Rae Byun, Hwaseong-si (KR); Sang Hoon Song, Hwaseong-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/555,074

(22) Filed: Aug. 29, 2019

(65) Prior Publication Data

US 2019/0386065 A1 Dec. 19, 2019

Related U.S. Application Data

(63) Continuation of application No. 16/110,518, filed on Aug. 23, 2018, now Pat. No. 10,446,611.

(30) Foreign Application Priority Data

Feb. 12, 2018 (KR) .................. 10-2018-0016815

(51) Int. Cl.
*H01L 27/146* (2006.01)
*H01L 27/30* (2006.01)
(Continued)

(52) U.S. Cl.
CPC ...... *H01L 27/307* (2013.01); *H01L 27/14621* (2013.01); *H01L 27/14645* (2013.01);
(Continued)

(58) Field of Classification Search
CPC ......... H01L 27/14621; H01L 27/14627; H01L 27/14636; H01L 27/14645;
(Continued)

(56) References Cited

U.S. PATENT DOCUMENTS 8,034,517 B2 10/2011 Tsao et al.
8,477,223 B2 7/2013 Itonaga
(Continued)

FOREIGN PATENT DOCUMENTS

| JP | 2005-294647 A | 10/2005 |
|---|---|---|
| JP | 2006-128433 A | 5/2006 |
| KR | 10-2003-0001055 A | 1/2003 |

*Primary Examiner* — Stephen W Smoot
(74) *Attorney, Agent, or Firm* — Lee IP Law, P.C.

(57) ABSTRACT

The present invention relates to image sensors and method of manufacturing the same. The image sensor may include a substrate having pixel regions in which photoelectric-conversion devices and storage node regions spaced apart from each other; a lower contact via between the photoelectric conversion-devices in the pixel regions; a first insulating layer on the lower contact via and having an opening; an upper contact via electrically connected to the lower contact via through the first insulating layer and protruding from the first insulating layer; a second insulating layer surrounding the first insulating layer and the upper contact via, an upper surface of the second insulating layer in the opening defining a trench; a color filter filling the trench; a protective film exposing the upper contact via; a first transparent electrode on the protective film that contacts the upper contact via; and an organic photoelectric layer on the first transparent electrode.

12 Claims, 12 Drawing Sheets

(51) Int. Cl.
*H01L 27/28* (2006.01)
*H01L 31/0224* (2006.01)
*H01L 31/0216* (2014.01)
*H01L 51/42* (2006.01)

(52) U.S. Cl.
CPC .. *H01L 27/14665* (2013.01); *H01L 27/14685* (2013.01); *H01L 27/14689* (2013.01); *H01L 27/286* (2013.01); *H01L 31/02162* (2013.01); *H01L 31/022466* (2013.01); *H01L 51/42* (2013.01); *H01L 27/14612* (2013.01); *H01L 27/14627* (2013.01); *H01L 27/14636* (2013.01); *H01L 27/14647* (2013.01)

(58) Field of Classification Search
CPC ......... H01L 27/14647; H01L 27/14685; H01L 27/14689; H01L 27/286; H01L 27/307; H01L 31/02162; H01L 31/022466; H01L 31/022475; H01L 31/022483; H01L 31/02327; H01L 31/1884; H01L 51/42; H01L 51/442
See application file for complete search history.

(56) References Cited

U.S. PATENT DOCUMENTS

| | | |
|---|---|---|
| 8,907,262 B2 | 12/2014 | Yamaguchi |
| 9,130,072 B1 | 9/2015 | Chen et al. |
| 9,373,732 B2 | 6/2016 | Velichko |
| 9,647,229 B2 | 5/2017 | Nakazawa et al. |
| 10,204,964 B1 | 2/2019 | Lee et al. |
| 2015/0001663 A1 | 1/2015 | Lee et al. |
| 2015/0115339 A1 | 4/2015 | Tamaki et al. |
| 2017/0170238 A1 | 6/2017 | Lee et al. |
| 2019/0131349 A1 | 5/2019 | Im et al. |

IMAGE SENSOR INCLUDING COLOR FILTERS

CROSS-REFERENCE TO RELATED APPLICATIONS

This is a continuation application based on pending application Ser. No. 16/110,518, filed Aug. 23, 2018, now U.S. Pat. No. 10,446,611 B2, the entire contents of which is hereby incorporated by reference.

Korean Patent Application No. 10-2018-0016815, filed on Feb. 12, 2018, in the Korean Intellectual Property Office (KIPO), and entitled: "Image Sensor Including Organic Photoelectric Layer and Method of Manufacturing the Same," is incorporated by reference herein in its entirety.

BACKGROUND

1. Field

Embodiments relate to an image sensor including color filters separated by two insulating layers and a method of manufacturing the same.

2. Discussion of the Related Art

An image sensor including a photodiode is used for cameras installed in vehicles, security devices, and robots, as well as for general consumer electronics, e.g., digital cameras, cell phone cameras, and portable camcorders. Due to size constraints and resolution demands, pixel sizes in image sensors have been reduced. These reduced pixels have an attendant reduced absorption area, which may degrade sensitivity.

SUMMARY

A method of manufacturing an image sensor according to an exemplary embodiment includes preparing a substrate having a first surface and a second surface, which is opposite to the first surface; forming a photoelectric-conversion device in the substrate adjacent the first surface; forming a storage node region adjacent to the first surface and spaced apart from the photoelectric-conversion device in the substrate; forming a lower contact via between the photoelectric-conversion device and the storage node region in the substrate; forming a first insulating layer on the lower contact via; forming an upper contact via electrically connected to the lower contact via on the second surface and partially protruding from an upper portion of the first insulating layer through the first insulating layer; forming a second insulating layer surrounding the first insulating layer and the upper contact via and having a protrusion protruding from an upper surface of the second insulating layer; forming a color filter having an upper surface at a level equal to or less than that of the upper surface of the second insulating layer on the second surface; forming a protective film that covers the color filter and exposes an upper surface of the upper contact via; forming a first transparent electrode in contact with the upper contact via; and sequentially forming an organic photoelectric layer and a second transparent electrode on the first transparent electrode.

An image sensor according to an exemplary embodiment includes a substrate including a plurality of pixel regions in which photoelectric-conversion devices and storage node regions spaced apart from the photoelectric-conversion devices are formed; a lower contact via formed between the photoelectric-conversion devices in the plurality of pixel regions; a first insulating layer formed on the lower contact via and having an opening; an upper contact via electrically connected to the lower contact via and protruding from upper and lower portions of the first insulating layer through the first insulating layer; a second insulating layer that surrounds the first insulating layer and the upper contact via, an upper surface of the second insulating layer in the opening defining a trench; a color filter formed on the second insulating layer in the trench; a protective film covering the color filter and exposing an upper surface of the upper contact via; a first transparent electrode on the protective film and in contact with the upper contact via; an organic photoelectric layer formed on the first transparent electrode; and a second transparent electrode on the organic photoelectric layer.

An image sensor according to an exemplary embodiment includes a substrate having a first surface and a second surface, which is opposite to the first surface, and including a plurality of pixel regions; color filters in the plurality of pixel regions on the second surface; a first insulating layer between the color filters; a second insulating layer between the first insulating layer and the color filters to surround the first insulating layer; an upper contact via passing through the first insulating layer and the second insulating layer; a protective film covering the color filter and exposing an upper surface of the upper contact via; a first transparent electrode on the protective film and in contact with the upper contact via; an organic photoelectric layer on the first transparent electrode; and a second transparent electrode on the organic photoelectric layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
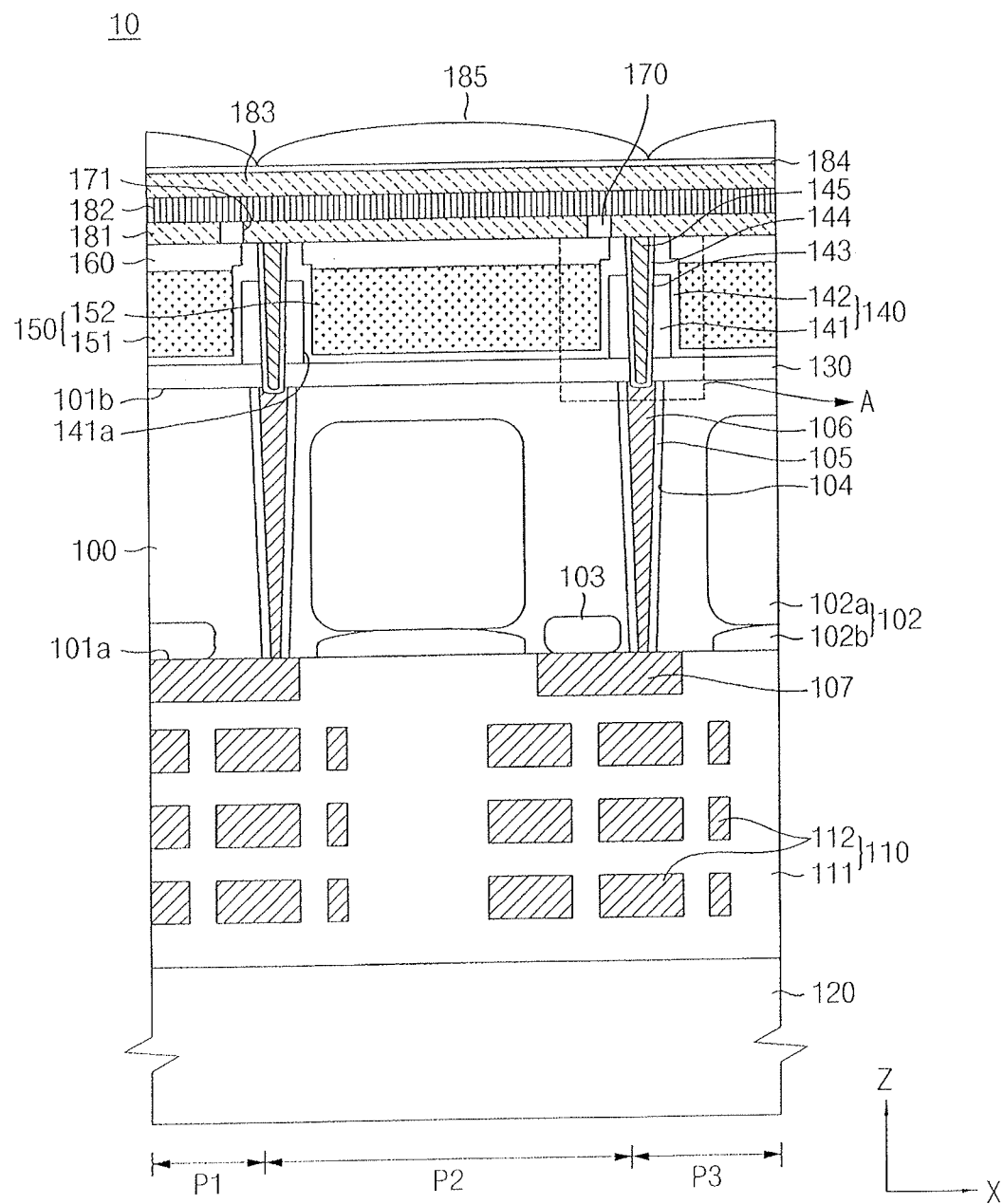
FIG. 1A illustrates a sectional view of an image sensor according to an embodiment.

FIG. 1A is a sectional view of an image sensor according to an embodiment. FIGS. 1B to 1E are enlarged sectional views of part A of FIG. 1A according to embodiments.

Referring to FIG. 1A, an image sensor 10 according to an embodiment includes a substrate 100 including a plurality of pixel regions P1, P2, and P3.

The substrate 100 may be any one of a bulk substrate, an epitaxial substrate, a silicon-on-insulator (SOI) substrate, or the like. For example, the substrate 100 may contain silicon (Si). Alternatively, the substrate 100 may contain a semiconductor element, e.g., germanium (Ge) and the like, or semiconductor compounds, e.g., silicon germanium (SiGe), silicon carbide (SiC), gallium arsenide (GaAs), indium arsenide (InAs), indium phosphide (InP), and the like. For example, the substrate 100 may be a p-type semiconductor substrate 100.

The substrate 100 may include a first surface 101a and a second surface 101b, opposite the first surface 101a along a z-direction. The first surface 101a may be a front surface of the substrate 100, and the second surface 101b may be a rear surface of the substrate 100, e.g., closest to a light receiving surface of the image sensor 10.

A photoelectric-conversion device 102 may be in regions of the substrate 100 corresponding to the plurality of pixel regions P1, P2, and P3. The photoelectric-conversion device 102 may be a photodiode. The photoelectric-conversion device 102 may be formed to be deep from the first surface 101a of the substrate 100. The photoelectric-conversion device 102 may include a first impurity region 102a and a second impurity region 102b. The first impurity region 102a may extend along the z-direction for a majority of the length between the first and second surfaces 101a, 101b of the substrate 100. The second impurity region 102b may be between the first impurity region 102a and the first surface 101a of the substrate 100 and may extend less along the z-direction than the first impurity region 102a. The first impurity region 102a and the second impurity region 102b may have different conductive types. For example, the first impurity region 102a may be doped with n-type impurities, and the second impurity region 102b may be doped with p-type impurities.

The photoelectric-conversion device 102 may be in pixels that detect red light and blue light. For example, pixels that detect red light may correspond to the first pixel region P1 and the third pixel region P3, and the pixel that detects blue light may correspond to the second pixel region P2.

A storage node region 103 may be in regions of the substrate 100 corresponding to the plurality of pixel regions P1, P2, and P3. The storage node region 103 may be in contact with the first surface 101a of the substrate 100 and disposed apart from the photoelectric-conversion device 102 along an x-direction. For example, the storage node region 103 may be doped with n-type impurities. The storage node region 103 may include a single doping region and may have a smaller area than the photoelectric-conversion device 102.

The substrate 100 may include a through hole 104. The through hole 104 may pass through the substrate 100, e.g., extend entirely through the substrate 100 along the z-direction. The through hole 104 may be spaced from the storage node region 103 along the x-direction and may be adjacent to the storage node region 103. The through hole 104 may have a width along the x-direction gradually increasing from the first surface 101a of the substrate 100 to the second surface 101b along the z-direction. That is, the width along the x-direction of the through hole 104 may be smaller in the first surface 101a of the substrate 100 than in the second surface 101b of the substrate 100.

An insulating film 105 may be on a side surface of the through hole 104. The insulating film 105 may be formed of an oxide-based material, a nitride-based material, and the like. The through hole 104 may be filled with a lower contact via 106. For example, the lower contact via 106 may be formed of a metal material, e.g., copper (Cu), aluminum (Al), tungsten (W), and the like.

A buffer layer 107 may be formed on the first surface 101a of the substrate 100. The buffer layer 107 may be in contact with the storage node region 103 and the lower contact via 106 exposed from the first surface 101a of the substrate 100. The storage node region 103 and the lower contact via 106 may be electrically connected to each other through the buffer layer 107. For example, the buffer layer 107 may contain a metal material such as, e.g., Cu, Al, W, and the like, or a carbon nanotube.

A wiring structure 110 may be on the first surface 101a of the substrate 100. The wiring structure 110 may include a front-interlayer-dielectric film 111 and a plurality of front wires 112. A high density plasma (HDP) oxide film, a tetraethoxysilane (TEOS) oxide film, a tonen silazane (TOSZ) film, a spin-on-glass (SOG) film, an undoped-silica-glass (USG) film, a low-κ dielectric layer, and the like may be used as the front-interlayer-dielectric film 111. For example, the plurality of front wires 112 may include a metal material, e.g., Cu, Al, W, and the like.

A supporting film 120 may be provided onto the wiring structure 110. The supporting film 120 may increase the strength of the substrate 100, which may be thinned during processing, e.g., a polishing process. For example, the supporting film 120 may be a silicon oxide film.

An anti-reflective film 130 may be on the second surface 101b of the substrate 100. The anti-reflective film 130 may prevent reflection of light so that the light propagates toward the photoelectric-conversion device 102. For example, the anti-reflective film 130 may be formed of a silicon nitride film, a silicon oxide film, a combination thereof, and the like.

An insulating layer 140 that covers the anti-reflective film 130 may be formed on the second surface 101b of the substrate 100. A contact hole 143 that passes through the insulating layer 140 may be formed on the insulating layer 140. The contact hole 143 may extend from the insulating layer 140 to the anti-reflective film 130 to pass through the anti-reflective film 130 in order to expose the lower contact via 106. The contact hole may extend into the lower contact via 106. The contact hole 143 may have a width in the x-direction that gradually decreases from the insulating layer 140 to the anti-reflective film 130. For example, the width of the contact hole 143 along the x-direction may be greater in an upper surface of the insulating layer 140 than in a lower surface of the anti-reflective film 130.

An anti-diffusion film 144 may be formed on a side surface and a bottom surface of the contact hole 143. For example, the anti-diffusion film 144 may contain at least one of titanium (Ti), titanium nitride (TiN), tantalum (Ta), tantalum nitride (TaN), titanium silicon nitride (TiSiN), tungsten nitride (WN), and the like. The contact hole 143 may be filled with an upper contact via 145. For example, the upper contact via 145 may be formed of a metal material, e.g., Cu, Al, W, and the like. The anti-diffusion film 144 may surround a side surface and a bottom surface of the upper contact via 145.

The insulating layer 140 may include a first insulating layer 141 having an opening 141a and a second insulating layer 142 formed in the opening 141a to cover the first insulating layer 141. The opening 141a may overlap the photoelectric-conversion device 102 in the z-direction and may expose a portion of an upper surface of the anti-reflective film 130. Alternatively, the anti-reflective film 130 may be removed between the substrate 100 and the insulating layer 140, such that a portion of the second surface 101b of the substrate 100 may be exposed by the opening 141a. An upper surface of the first insulating layer 141 may be at a lower level than an upper surface of the upper contact via 145, e.g., the upper surface of the upper contact via 145 may extend along the z-direction further than the upper surface of the first insulating layer 141. A portion of the upper contact via 145 may protrude from the upper surface of the first insulating layer 141. The anti-diffusion film 144 and the upper contact via 145 may pass through the first insulating layer 141 to protrude toward an upper portion and a lower portion of the first insulating layer 141.

Figure 1B:
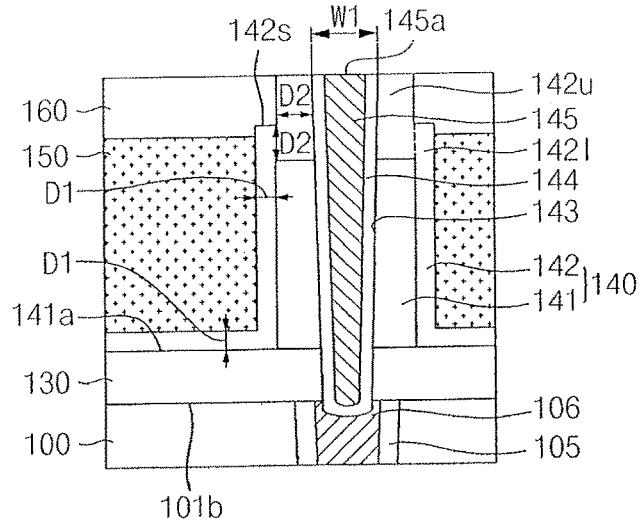
FIGS. 1B to 1E illustrate enlarged sectional views of a part A of FIG. 1A according to embodiments.

As shown in detail in FIGS. 1B to 1E, the second insulating layer 142 may be formed as a multi-layer structure with steps. For example, as may be seen in FIG. 1B, the second insulating layer 142 may include a lower layer 142*l* that is in contact with the upper surface of the anti-reflective film 130 and a side surface of the first insulating layer 141, and an upper layer 142*u* that is in contact with the upper surface of the first insulating layer 141 and a side surface of the anti-diffusion film 144. In FIG. 1B, a dotted line indicates a notional boundary between the lower layer 142*l* and the upper layer 142*u*. For example, the lower layer 142*l* may only contact a side surface of the first insulating layer 141 and the upper layer 142*u* may only contact the upper surface of the first insulating layer 141.

The lower layer 142*l* may have an upper surface 142*s* that is at a higher level than the upper surface of the first insulating layer 141, but lower than an upper surface 145*a* of the upper contact via 145. The upper layer 142*u* of the second insulating layer 142 may surround a side surface of a portion of the upper contact via 145 protruding from the upper surface of the first insulating layer 141 and may expose the upper surface of the upper contact via 145. At least one of a HDP oxide film, a TEOS oxide film, a TOSZ film, a SOG film, an USG film, a low-K dielectric layer, and the like may form the insulating film 105. For example, the insulating film 105 may be a phosphorous tetraethyl orthosilicate (PTEOS) oxide film.

Figure 1C:
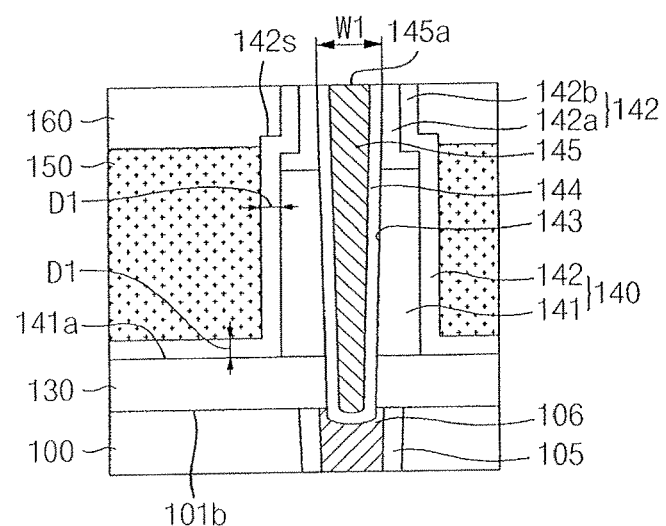

Referring to FIG. 1C, the second insulating layer 142 may include a capping film pattern 142*a* that covers the upper surface of the first insulating layer 141 and surrounds a portion protruding from the upper surface of the first insulating layer 141 of the upper contact via 145. The second insulating layer 142 may include an insulating layer liner 142*b* that covers the side surface of the first insulating layer 141 and the capping film pattern 142*a*. The capping film pattern 142*a* and the insulating layer liner 142*b* may be formed of different materials. Alternatively, the capping film pattern 142*a* and the insulating layer liner 142*b* may be formed of the same material.

Referring back to FIG. 1A, a color filter 150 may be formed in the opening 141*a* on the second surface 101*b* of the substrate 100. The color filter 150 may transmit incident light through a microlens 185 so that only light of a predetermined wavelength, e.g., light to be sensed, propagates to the photoelectric-conversion device 102 through the second surface 101*b*. The color filter 150 may be formed at the same level as, or at a lower level than, the upper surface 142*s* of the lower layer 142*l* of the second insulating layer 142, as may be seen in embodiments of FIGS. 1B to 1E. Thus, the upper surface 142*s* of the lower layer 142*l* of the second insulating layer 142 may define an upper limit of a trench to be filled with the color filter 150. In other words, the lower layer 142*l* in the opening 141*a* may extend along a bottom surface of the opening 141*a* in the x-direction between facing adjacent first insulating layers 141 and along facing side surfaces of the facing adjacent first insulating layers 141 along the z-direction, e.g., further along the z-direction than the upper surface of the first insulating layer 141, to define a trench. Additionally, the upper layer 142*u* may extend from the upper surface of the first insulating layer 141 along sides surfaces of the upper contact via 145 such that the upper contact via 145 protrudes from the first insulating layer 141 is insulated.

The color filter 150 may include a first color filter 151 and a second color filter 152. The first color filter 151 may be in each of the first pixel region P1 and the third pixel region P3 to correspond to the photoelectric-conversion device 102. The second color filter 152 may be in the second pixel region P2 to correspond to the photoelectric-conversion device 102. For example, the first color filter 151 may be a red color filter and the second color filter 152 may be a blue color filter. Light of a red wavelength may be transmitted in the first pixel region P1 so that red light reaches the photoelectric-conversion device 102. Also, light of a blue wavelength may be transmitted in the second pixel region P2 so that blue light reaches the photoelectric-conversion device 102.

A protective film 160 that covers the color filter 150 may be formed on the second surface 101*b* of the substrate 100. The protective film 160 may expose an upper surface of the upper layer 142*u* of the second insulating layer 142 and the upper surface 145*a* of the upper contact via 145. An upper surface of the protective film 160 may be at the same level as the upper surface 145*a* of the upper contact via 145. The protective film 160 may be an inorganic-oxide film. The protective film 160 may contain at least one of a silicon oxide film, a titanium oxide film, a zirconium oxide film ($ZrO_2$), a hafnium oxide film ($HfO_2$), and the like. For example, the protective film 160 may be a low temperature oxide (LTO) or a low-low temperature oxide (LLTO), which is a kind of silicon oxide film. A protective film 160 composed of an LTO or an LLTO may reduce damage to lower films of the protective film 160. Since the protective film 160 is amorphous, the protective film 160 may not be rough, thus reducing reflection, refraction, and/or scattering of incident light.

A separation pattern 170 may be formed on the protective film 160. The separation pattern 170 may include a plurality of separated spaces, e.g., spaced along the x-direction, corresponding to the plurality of pixel regions P1, P2, and P3. Along the z-direction, the separated spaces may overlap a portion of the color filters 150 on one side thereof and not overlap the upper contact via 145. A first transparent electrode 181 may be in each of the separated spaces 171 and in contact with the upper contact via 145. The first transparent electrode 181 may be electrically connected to the storage node region 103 through the lower contact via 106, the upper contact via 145, and the buffer layer 107. A layer of a second transparent electrode 183 may be made of a material such as indium tin oxide (ITO), indium zinc oxide (IZO), ZnO, $SnO_2$, antimony-doped tin oxide (ATO), Al-doped zinc oxide (AZO), gallium-doped zinc oxide (GZO), $TiO_2$, or fluorine-doped tin oxide (FTO).

An organic photoelectric layer 182 and the second transparent electrode 183 may be sequentially disposed on the first transparent electrode 181. The organic photoelectric layer 182 may be integrally formed on a plurality of first transparent electrodes 181. The organic photoelectric layer 182 and the second transparent electrode 183 may be continuous along the x-direction.

The organic photoelectric layer 182 may be an organic material that causes photoelectric conversion only at certain wavelengths of light. For example, the organic photoelectric layer 182 may cause photoelectric conversion only at green wavelengths of light. For example, the organic photoelectric layer 182 may have maximum absorption wavelengths in a range of 500 nm to 600 nm in all of the first, second, and third pixel regions P1, P2, and P3. Thus, sensitivity of the image sensor 10 may be improved.

The organic photoelectric layer 182 may be a layer where a p-type semiconductor material and an n-type semiconductor material form a pn flat junction or a bulk heterojunction. The organic photoelectric layer 182 may have a single layer structure or a multi-layer structure. The organic photoelectric layer 182 may be a layer in which incident light is received, an exciton is produced, and then the exciton is separated into a hole and an electron. The p-type semiconductor material and the n-type semiconductor material may absorb green wavelengths of light and may have the maximum absorption peaks in a wavelength range of about 500 nm to about 600 nm.

The layer of the second transparent electrode 183 may be formed on the organic photoelectric layer 182. For example, the second transparent electrode 183 may be made of ITO, IZO, ZnO, $SnO_2$, ATO, AZO, GZO, $TiO_2$, FTO, and the like. The second transparent electrode 183 may be integrally formed over the first, second, and third pixel regions P1, P2, and P3.

A microlens 185 corresponding to each of the color filters 150 may be on the second transparent electrode 183. The microlens 185 may overlap a corresponding color filter 150 along the z-direction. The microlens 185 may change a path of incident light to a region other than the photoelectric-conversion device 102 to condense, e.g., focus, the light on the photoelectric-conversion device 102.

A protective layer 184 may be formed between the microlens 185 and the second transparent electrode 183. The protective layer 184 may be made of a transparent insulation material.

Further variations of the insulating layer 140 will be described in detail below in connection with FIGS. 1B to 1E, which are enlarged sectional views of a part A of FIG. 1A. In FIGS. 1B to 1E, the same reference numerals denote the same components, and in order to simplify the description, a redundant description thereof will be omitted.

Figure 1D:
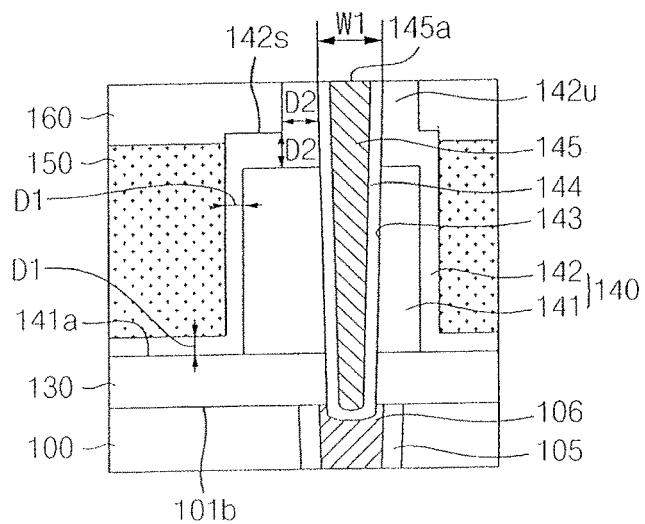
Figure 1E:
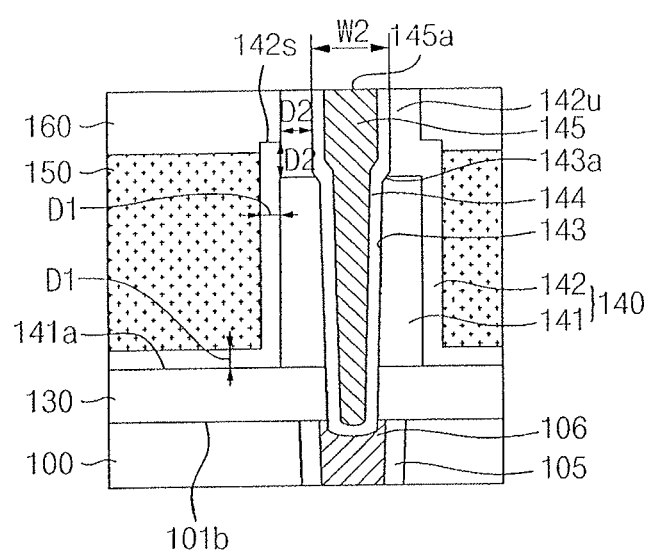

Referring to FIGS. 1B, 1C, and 1E, the contact hole 143 may be formed at the center of the first insulating layer 141. In contrast, as shown in FIG. 1D, the contact hole 143 may be formed at positions biased leftward or rightward from the center of the first insulating layer 141. For example, when the contact hole 143 and the first insulating layer 141 are included in a pixel region located at the center of an image sensor, the contact hole 143 may be formed at the center of the first insulating layer 141 as shown in FIGS. 1B, 1C, and 1E. On the other hand, when the contact hole 143 and the first insulating layer 141 are included in a pixel region located at positions other than the center of the image sensor, the contact hole 143 may be formed at a position biased from the center of the first insulating layer 141 as shown in FIG. 1D.

Referring to FIG. 1E, the contact hole 143 may have a side surface with a discontinuously changing slope. For example, the side surface of the contact hole 143 may include a first inclination part 143a with a portion having a gentler slope than other portions. The first inclination part 143a may be formed either inward into or outward from the contact hole 143 depending on relative etch selectivities of the first insulating layer 141 and the second insulating layer 142. Here, whether the direction of the slope is outward or inward is determined on the basis of a direction from an upper portion of the contact hole 143 to a lower portion of the contact hole 143. The first inclination part 143a may be formed in a part adjacent to the upper surface of the first insulating layer 141. The anti-diffusion film 144 and the upper contact via 145 formed in the contact hole 143 having the first inclination part 143a may have a side surface with a slope discontinuously changing along the first inclination part 143a.

For example, the upper surface of the contact hole 143 with the first inclination part 143a inwardly inclined with respect to the contact hole 143 is shown in FIG. 1E. Here, the upper surface of the contact hole 143 may have a width W2 greater than a width W1 of the upper surface of the contact hole 143 with no first inclination part 143a, as shown in FIGS. 1B, 1C, and 1D. The etch selectivities of the first insulating layer 141 and the second insulating layer 142 may be greater in FIG. 1D than in these figures. Alternatively, the upper surface of the contact hole 143 with the first inclination part outwardly inclined with respect to the contact hole 143 may have a width greater than the width W1 of the upper surface of the contact hole 143 with no first inclination part.

Alternatively, the contact hole 143 may have a side surface with a discontinuously changing slope below the first inclination part 143a. For example, the side surface of the contact hole 143 may include a second inclination part with a portion having a more gentle slope than other portions. The second inclination part may be formed either inward into or outward from the contact hole 143 depending on etch selectivities of the anti-reflective film 130 and the first insulating layer 141. The second inclination part may be formed at a part adjacent to the upper surface of the anti-reflective film 130. The contact hole 143 having the second inclination part that is gently inclined outward from the contact hole 143 has a width increasing upward from the second surface 101b and then decreasing due to the second inclination part formed at the same level as that of the upper surface of the anti-reflective film 130. The width of the contact hole 143 may gradually increase upward from the second inclination part again. The contact hole 143 having the second inclination part that is inclined inward into the contact hole 143 has a width gradually increasing upward from the second surface 101b and then rapidly increasing due to the second inclination part formed at the same level as that of the upper surface of the anti-reflective film 130. The width of the contact hole 143 may gradually increase upward from the second inclination part again.

The anti-diffusion film 144 and the upper contact via 145 formed in the contact hole 143 having the second inclination part may have a side surface with a slope discontinuously changing along the second inclination part. Both of the first inclination part 143a and the second inclination part may be formed in the contact hole 143. The anti-diffusion film 144 and the upper contact via 145 formed in the contact hole 143 having the first inclination part 143a and the second inclination part may have portions of a side surface with a slope discontinuously changing along the first inclination part 143a and the second inclination part.

Referring to FIGS. 1B to 1E, the second insulating layer 142 has different thicknesses at different portions thereof. A thickness D1 of the second insulating layer 142 formed in the opening 141a may be smaller than a thickness D2 of the second insulating layer 142 formed on the first insulating layer 141. The thickness D1 of the second insulating layer 142 formed in the opening 141a may be equal to the thickness of the insulating layer liner 142b, and the thickness D2 of the second insulating layer 142 formed on the first insulating layer 141 may be equal to the sum of the thickness of the capping film pattern 142a and the thickness of the insulating layer liner 142b of FIG. 1C. In other words, a thickness D2 of the upper layer 142u that protrudes from the upper surface of the first insulating layer 141 (measured relative to an outer side surface of the anti-diffusion film 144 along the x-direction and an upper surface of the first insulating layer 141 along the z-direction) may be the same in all embodiments shown in FIG. 1B to 1E and greater than the thickness D1 of the lower layer 142l along the x-direction and the z-direction. The second insulating layer 142 may be formed to be thicker on the first insulating layer 141 than in the opening 141a by depositing the capping film pattern 142a that covers the upper surface of the first insulating layer 141 and then depositing the insulating layer liner 142b that covers the deposited capping film pattern 142a and also the opening 141a, described in detail below with reference to FIGS. 11-13.

Figure 2:
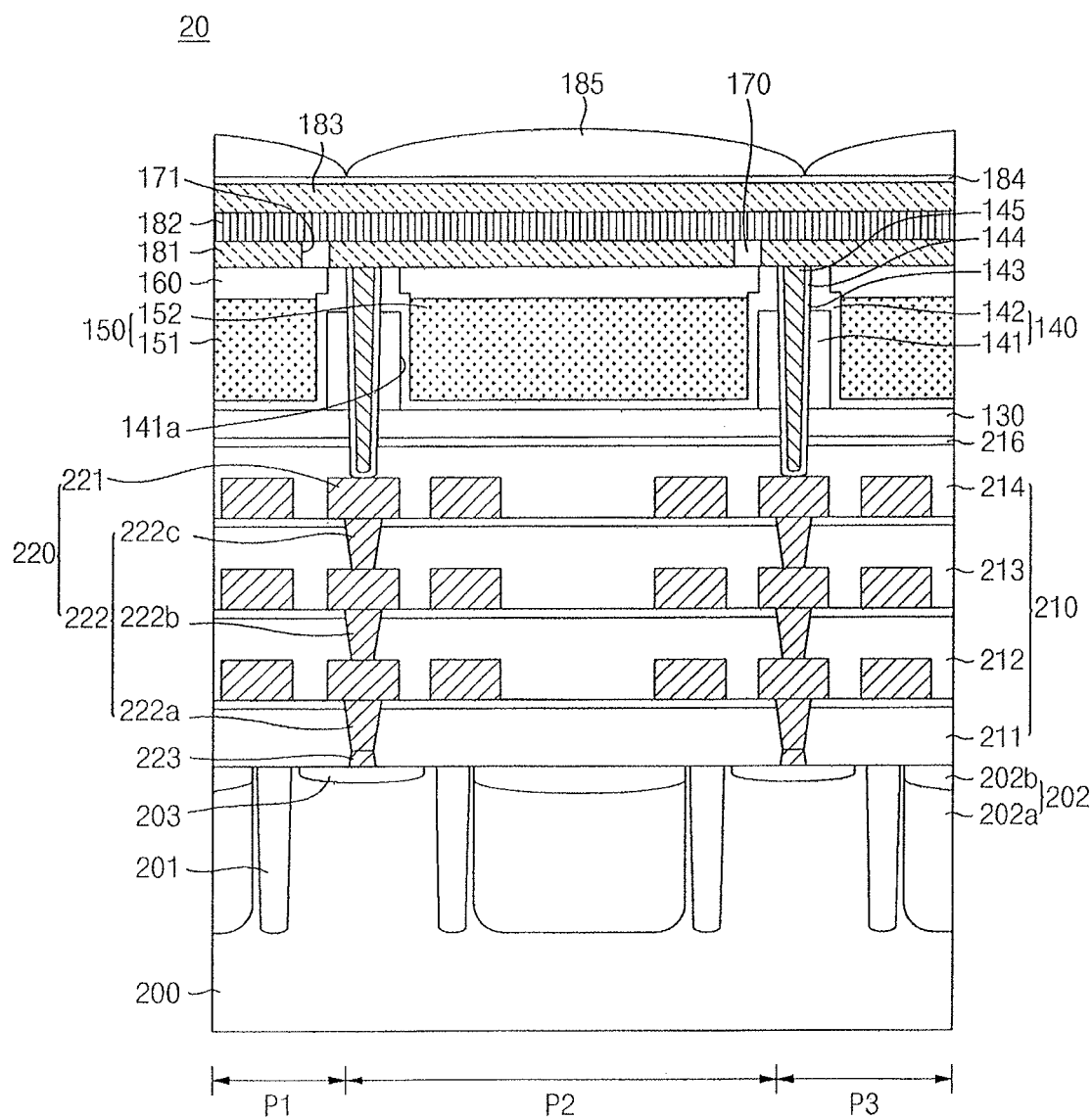
FIG. 2 illustrates a sectional view of an image sensor according to an embodiment.

FIG. 2 is a sectional view of an image sensor according to an embodiment. In FIGS. 1A and 2, the same reference numerals denote the same components, and in order to simplify the description, a redundant description thereof will be omitted.

Referring to FIG. 2, a device separation film 201 may be on a substrate 200 of an image sensor 20. The device separation film 201 may define a plurality of pixel regions P1, P2, and P3. A photoelectric-conversion device 202 may be in regions of the substrate 200 corresponding to the pixel regions. The photoelectric-conversion device 202 may include a first impurity region 202a and a second impurity region 202b. The first impurity region 202a may extend along the z-direction for a majority of the length between the upper and lower surfaces of the substrate 200. The second impurity region 202b may be between the first impurity region 202a and a surface of the substrate 200 facing a light receiving surface of the sensor 20, and may extend less along the z-direction than the first impurity region 202a. The first impurity region 202a and the second impurity region 202b may have different conductivity types. For example, the first impurity region 202a may be doped with n-type impurities, and the second impurity region 202b may be doped with p-type impurities.

The photoelectric-conversion device 202 may be in pixels that detect red light and blue light. For example, the pixel that detects red light may correspond to the first pixel region P1 and the third pixel region P3, and the pixel that detects blue light may correspond to be the second pixel region P2.

A storage node region 203 may be in regions of the substrate 200 corresponding to the plurality of pixel regions P1, P2, and P3. The storage node region 203 may be in contact with the upper surface of the substrate 200 and apart from the photoelectric-conversion device 202 along the x-direction. For example, the storage node region 203 may be doped with n-type impurities. The storage node region 203 may be a single doping region having a smaller area than the photoelectric-conversion device 202.

An interlayer dielectric structure 210, 216 may be on the substrate 200. The interlayer dielectric structure 210, 216 may include a plurality of interlayer dielectric films 210 sequentially stacked on the substrate 200 and a plurality of etch stop films 216 on upper surfaces of the plurality of interlayer dielectric films 210.

An uppermost interlayer dielectric film 214 among the plurality of interlayer dielectric films 210 may be thicker than the other interlayer dielectric films 211, 212, and 213. The plurality of interlayer dielectric films 210 may be made of an oxide. For example, the plurality of interlayer dielectric films 210 may be composed of an HDP oxide film, a TEOS oxide film, a TOSZ film, an SOG film, a USG film, a low-K dielectric layer, or the like. The etch stop films 216 may be formed of a silicon nitride film or a silicon oxynitride film.

A wiring structure 220 may be in each of the plurality of pixel regions P1, P2, and P3. The wiring structure 220 may contain a metal material, e.g., Cu, Al, W, and the like.

The wiring structure 220 may include interlayer wires 221 in at least some of the plurality of interlayer dielectric films 210 and lower contact vias 222 passing through the plurality of interlayer dielectric films 210 and connecting the interlayer wires 221. The lower contact vias 222 may include a lowermost contact via 222a, an intermediate contact via 222b, and an uppermost contact via 222c. The lowermost contact via 222a may be in contact with the storage node region 203.

According to an embodiment, a buffer via 223 may be between the lowermost contact via 222a and the storage node region 203. For example, the buffer via 223 may include a carbon nanotube.

Generally, in order to electrically connect the wiring structure 220 and the storage node region 203, the substrate 200 forms a metal contact. When a metal is brought into contact with a semiconductor having a low impurity concentration, a potential barrier is formed on a contact surface, and thus a good ohmic contact cannot be expected. Accordingly, when the wiring structure 220 and the storage node region 203 are connected by the metal contact, an ion implantation process, in which impurities are implanted into the surface of the substrate 200 in the storage node region 203, is performed in order to reduce high contact resistance. In this case, during the ion implantation process, the semiconductor substrate 200 is damaged, and many dark electrons are generated in the image sensor. As a result, the performance of the image sensor is degraded.

According to an embodiment, the buffer via 223 may provide a material having a work function between those of silicon and a metal and may lower an energy barrier between the semiconductor substrate 200 and the wiring structure 220. Thus, good ohmic contact can be realized. For example, the silicon in the semiconductor substrate 200 has a work function of 4.05 eV, the metal (e.g., copper) in the wiring structure 220 has a work function of 4.70 eV, and the buffer via 223 (e.g., a carbon nanotube) has a work function of about 4.3 eV to about 4.8 eV. The buffer via 223 may reduce the energy barrier between the silicon and the metal, thus facilitating transfer of electrons and/or holes to the storage node region 203 through the wiring structure 220. Accordingly, performance of the image sensor may be improved.

The upper contact via 145 may be formed on an uppermost interlayer wire through the etch stop film 216 and the uppermost interlayer dielectric film 214. The anti-diffusion film 144 may surround a side surface and a bottom surface of the upper contact via 145 and may be in contact with the uppermost interlayer wire. The upper contact via 145 may be electrically connected to the storage node region 203 through the interlayer wires 221 and the lower contact vias 222.

FIGS. 3 to 18 are sectional views of stages in a method of manufacturing the image sensor of FIGS. 1A and 1C. Duplicate content of the foregoing description with reference to FIG. 1A will be omitted in the following description with reference to FIGS. 3 to 18.

Figure 3:
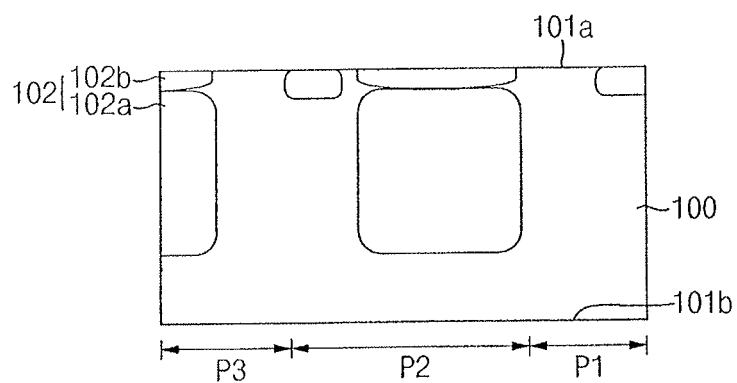
FIGS. 3 to 18 illustrate sectional views of stages in a method of manufacturing the image sensor according to an embodiment.

Referring to FIG. 3, the substrate 100 having a plurality of pixel regions P1, P2, and P3 may be prepared. A plurality of photoelectric-conversion devices 102 and a plurality of storage node regions 103 spaced apart from the plurality of photoelectric-conversion devices 102 along the x-direction may be formed in the plurality of pixel regions P1, P2, and P3 of the substrate 100.

Figure 4:
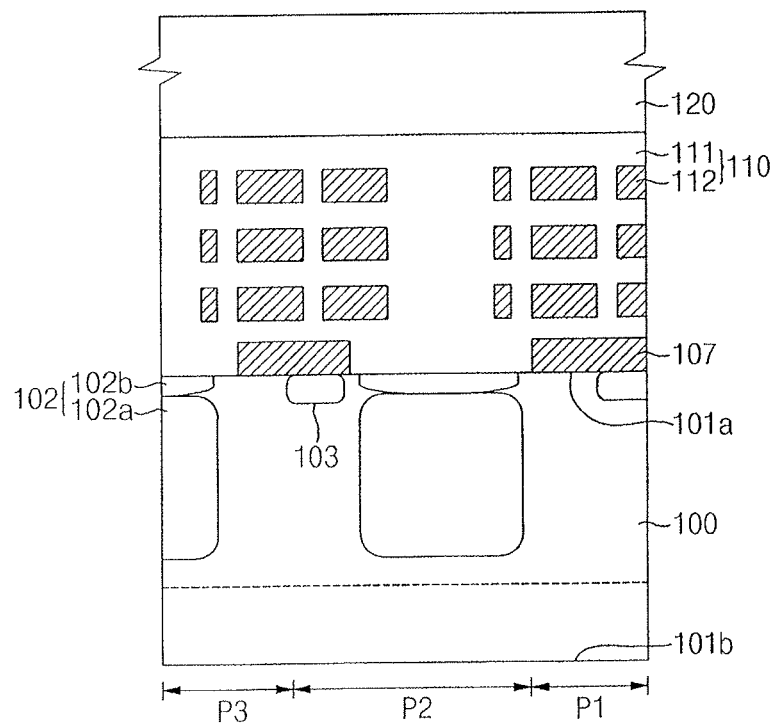

Referring to FIG. 4, the buffer layer 107 may be formed on the first surface 101a of the substrate 100. The buffer layer 107 may be electrically connected to the storage node regions 103. A wiring structure 110 may be formed on the first surface 101a of the substrate 100. The wiring structure 110 may be formed to include a front-interlayer-dielectric film 111 and a plurality of front wires 112. A supporting film 120 may be formed on the wiring structure 110.

Figure 5:
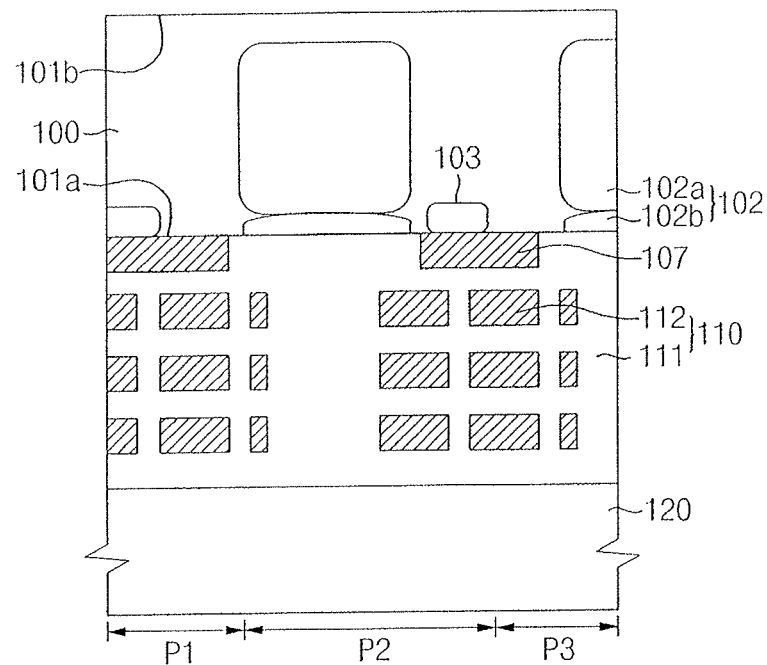

Referring to FIG. 5, the substrate 100 may be flipped so that the wiring structure 110 is at a lower side of the substrate 100. Subsequently, a portion (a part below a dotted line) of the lower side of the substrate 100 shown in FIG. 4 may be removed.

Figure 6:
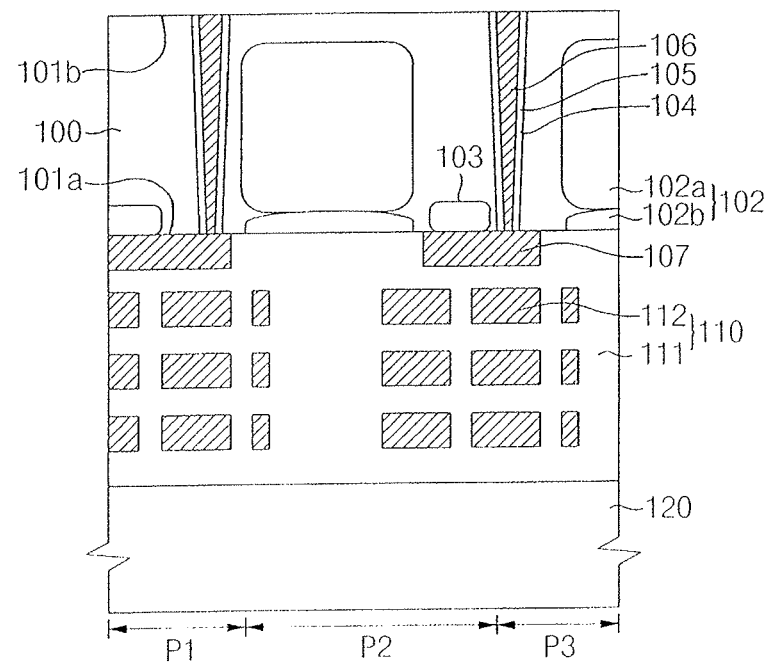

Referring to FIG. 6, the through hole 104 that passes through the semiconductor substrate 100 may be formed in a range from the second surface 101b of the substrate 100 to the buffer layer 107. The through hole 104 may have a width gradually decreasing from the second surface 101b to the first surface 101a. The insulating film 105 may be formed on a side surface of the through hole 104. the lower contact via 106 may be formed on a side surface of the insulating film 105, and the through hole 104 may be fully filled with the lower contact via 106.

Figure 7:
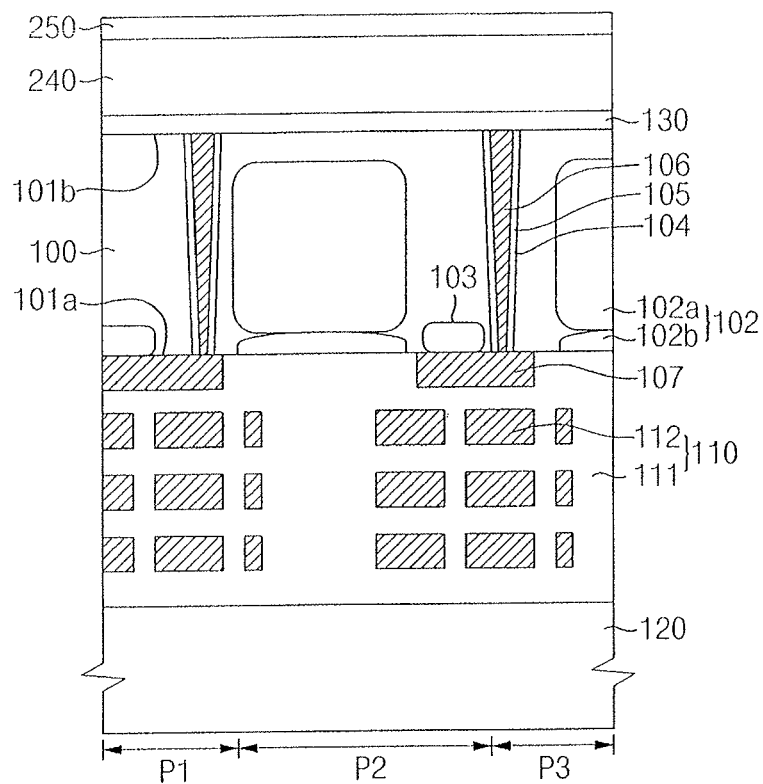

Referring to FIG. 7, the anti-reflective film 130 may be formed on the second surface 101b of the substrate 100. The anti-reflective film 130 may cover all of the second surface 101b of the substrate 100, an upper surface of the insulating film 105, and an upper surface of the lower contact via 106.

An interlayer dielectric layer 240 and a mask film 250 may be sequentially formed on the anti-reflective film 130. At least one of an HDP oxide film, a TEOS oxide film, a TOSZ film, an SOG film, a USG film, and a low-K dielectric layer may form the interlayer dielectric layer 240. For example, a PTEOS oxide film may be formed as the interlayer dielectric layer 240.

Figure 15:
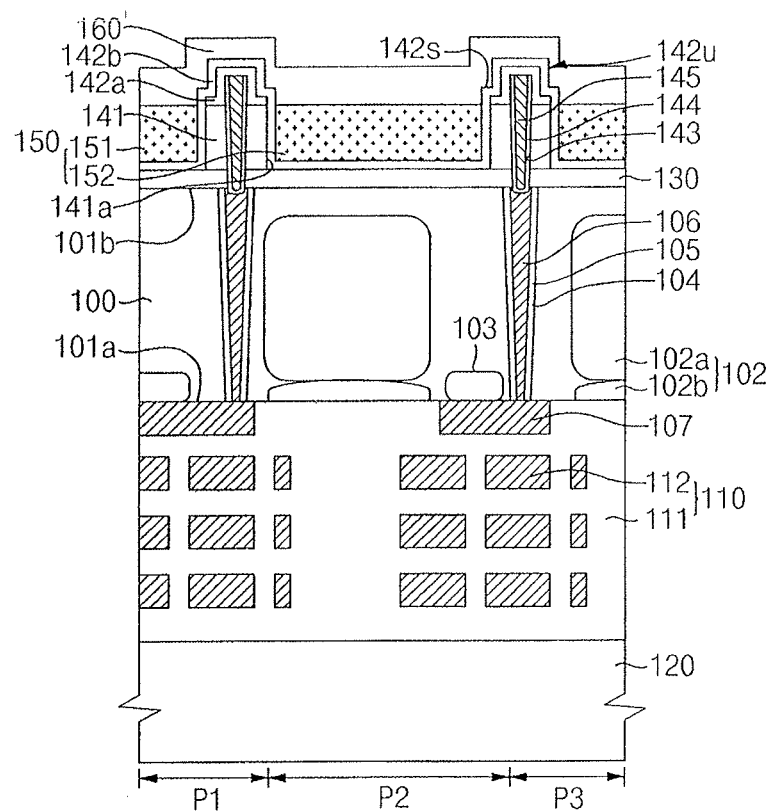

The thickness of the mask film 250 may be greater than or equal to that of the protective film 160 that is to cover a color filter 150 (FIG. 15). The mask film 250 may be made of a material having the same etch selectivity as that of the interlayer dielectric layer 240. For example, the mask film 250 may be made of low-temperature silicon nitride (LT-SiN).

Figure 8:
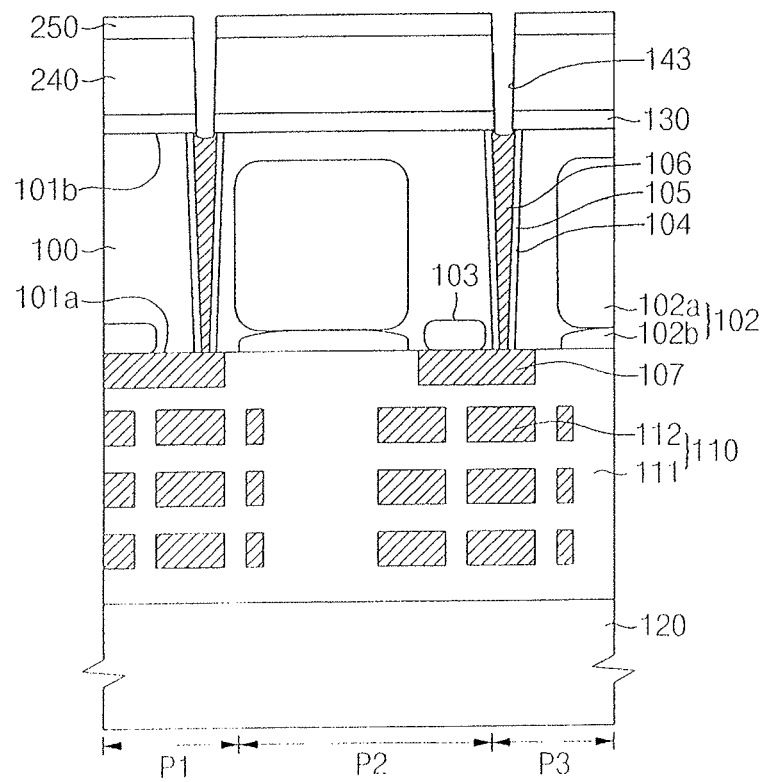

Referring to FIG. 8, a first photoresist film may be formed on the mask film 250, and the contact hole 143 passing through the anti-reflective film 130, the interlayer dielectric layer 240, and the mask film 250 may be formed by using the first photoresist film as an anti-etching film. The first photoresist film may be formed so that a part of an upper surface of the mask film 250 overlapping the lower contact via 106 in the z-direction is exposed.

The contact hole 143 may be formed to have one of the shapes of the contact holes 143 shown in FIGS. 1B to 1E depending on etch selectivities of the anti-reflective film 130, the interlayer dielectric layer 240, and the mask film 250. The first photoresist film may be removed after the contact hole 143 is formed. The contact hole 143 may expose and may slightly extend into the lower contact via 106.

Figure 9:
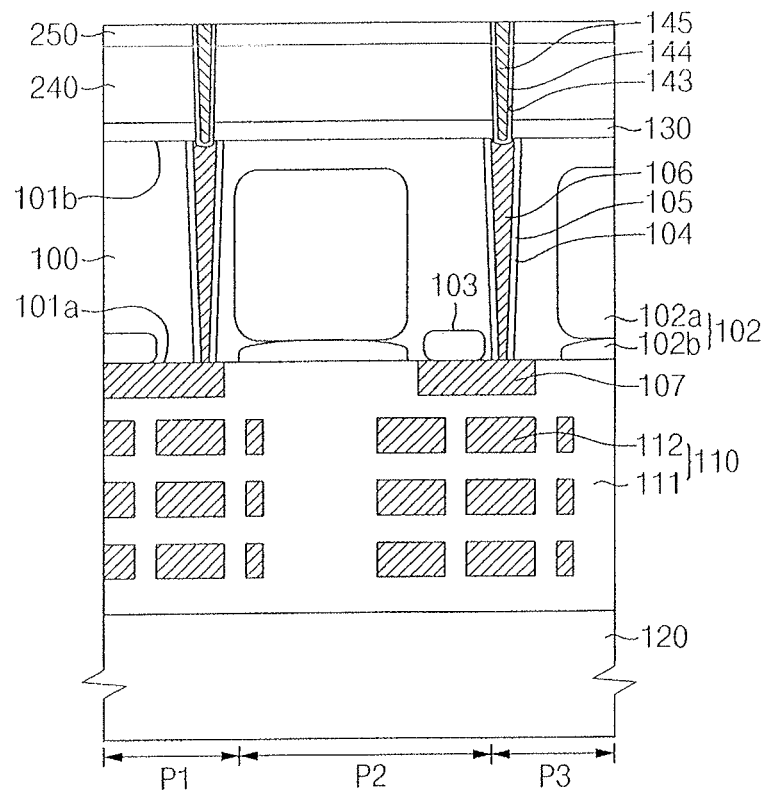

Referring to FIG. 9, the anti-diffusion film 144 may be formed on the contact hole 143. The anti-diffusion film 144 may be formed on a side surface and a bottom surface of the contact hole 143. The anti-diffusion film 144 may be formed in contact with the lower contact via 106, the anti-reflective film 130, the interlayer dielectric layer 240, and the mask film 250 that are exposed through the contact hole 143. An upper contact via 145 may be formed in the contact hole 143 on which the anti-diffusion film 144 is formed. The anti-diffusion film 144 may surround a side surface and a bottom surface of the upper contact via 145. The upper contact via 145 may be formed in contact with the anti-diffusion film 144, and a residual space of the contact hole 143 remaining after the anti-diffusion film 144 is formed may be fully filled with the upper contact via 145.

A planarization process may be performed so that upper surfaces of the mask film 250, the anti-diffusion film 144, and the upper contact via 145 are at the same level. A chemical mechanical polishing (CMP) process may be used as the planarization process.

Figure 10:
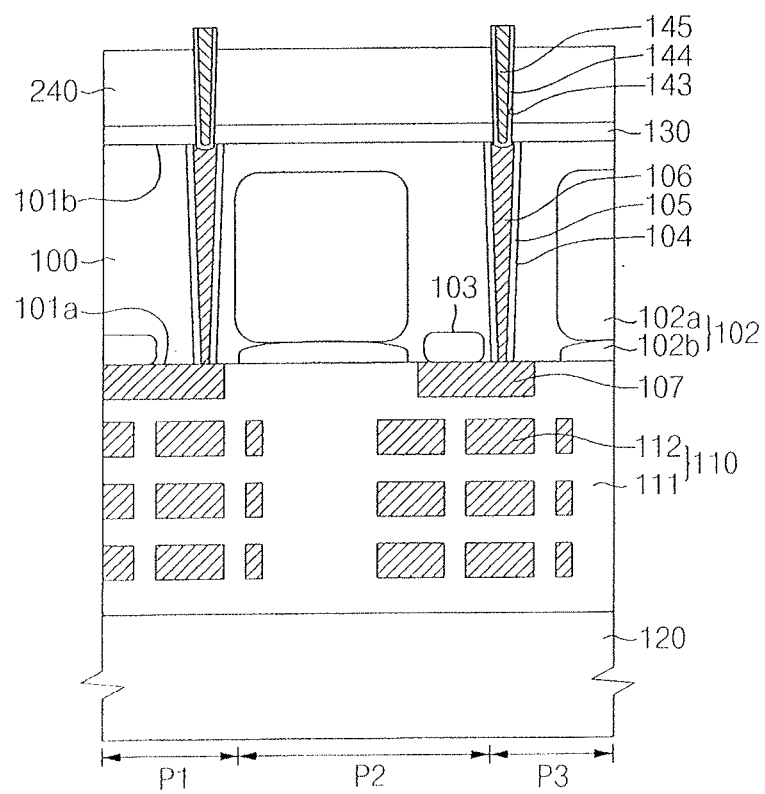

Referring to FIG. 10, an upper surface of the interlayer dielectric layer 240 may be exposed by removing the mask film 250. The anti-diffusion film 144 and the upper contact via 145 may protrude from the upper surface of the interlayer dielectric layer 240 along the z-direction. For example, the mask film 250 may be removed by using an ashing and/or strip process.

Figure 11:
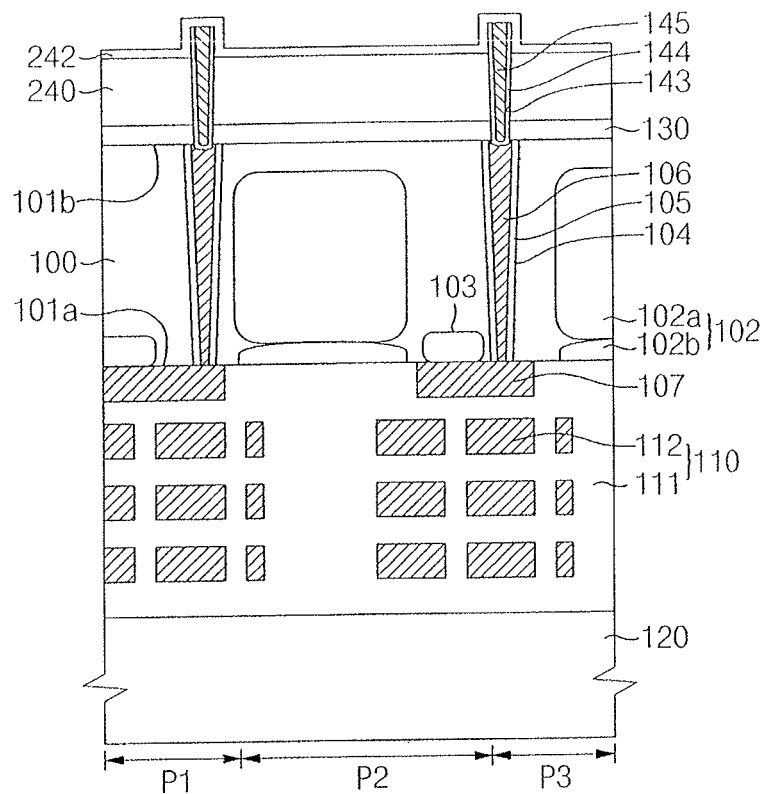

Referring to FIG. 11, a capping film 242 that covers the upper surface of the interlayer dielectric layer 240, the anti-diffusion film 144 protruding from the upper surface of the interlayer dielectric layer 240, and the upper contact via 145 may be formed, e.g., may be conformal thereto. The capping film 242 may have a protruding part that covers the protruding upper contact via 145. The capping film 242 may be made. e.g., of silicon oxide, silicon nitride, a combination thereof, and the like. The capping film 242 may be formed by using an atomic-layer-deposition (ALD) process, a chemical-vapor deposition (CVD) process, a radical-oxidation process, a natural-oxidation process, and the like.

Figure 12:
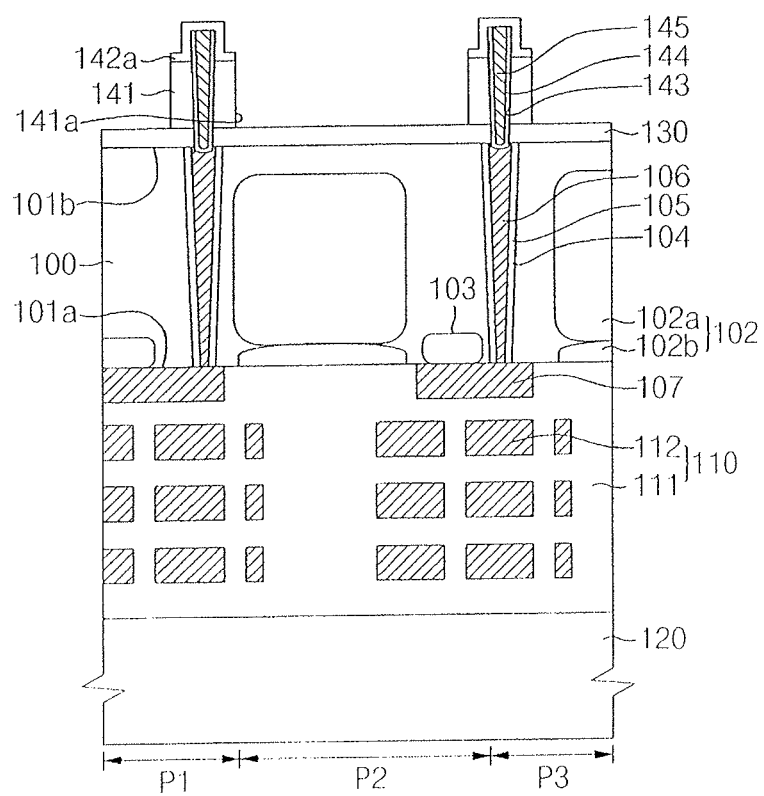

Referring to FIG. 12, a second photoresist film may be formed on the capping film 242. The second photoresist film may cover a protruding part of the capping film 242 and its adjacent portions extending along the x-direction on the interlayer dielectric layer 240 and expose the other parts. Subsequently, a capping film pattern 142a may be formed by removing the exposed part of the capping film 242 using the second photoresist film as an anti-etching film. Also, the first insulating layer 141 having the opening 141a therein may be formed by removing a portion corresponding to the exposed part of the capping film 242 in the interlayer dielectric layer 240 using the second photoresist film as an anti-etching film. The interlayer dielectric layer 240 may be removed until the anti-reflective film 130 is exposed. Thus, the anti-reflective film 130 may be exposed by the opening 141a.

Figure 13:
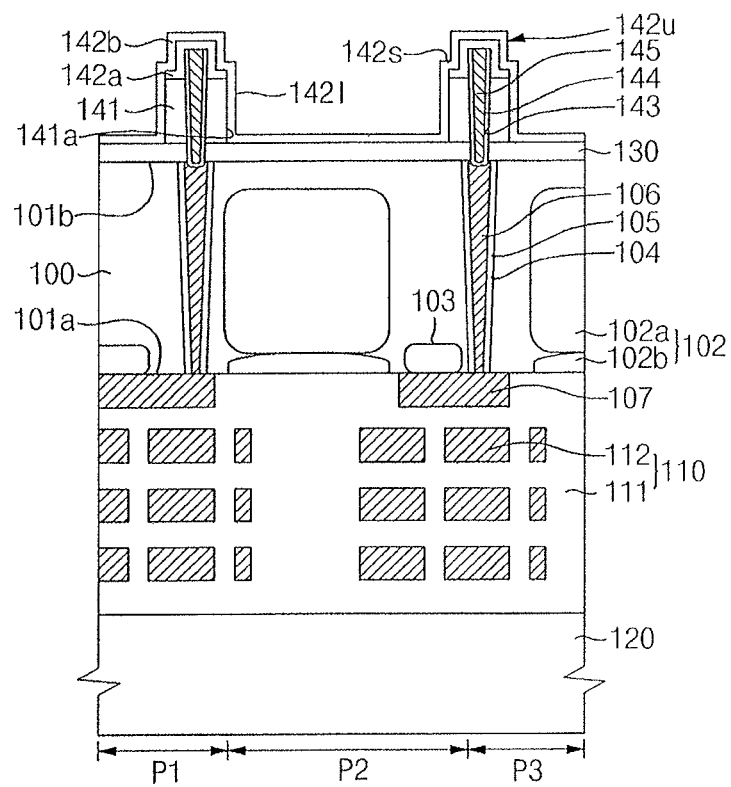

Referring to FIG. 13, the insulating layer liner 142b may be formed in the opening 141a. The insulating layer liner 142b may cover the exposed upper surface of the anti-reflective film 130, a side surface of the opening 141a, and the capping film pattern 142a, e.g., may be conformal thereto. The insulating layer liner 142b may have the lower layer 142l and a protruding portion that extends past the upper surface 142s and covers a protruding part of the capping film pattern 142a. The upper surface 142s of the insulating layer liner 142b, i.e., the lower layer 142l, may be at a higher level than an upper surface of the first insulating layer 141 and at a lower level than the upper surface of the upper contact via 145. The insulating layer liner 142b may be made of, e.g., silicon oxide, silicon nitride, a combination thereof, and the like. The insulating layer liner 142b may be formed by using an ALD process, a CVD process, a radical-oxidation process, a natural-oxidation process, and the like. In FIG. 13, the upper layer 142u is formed by the capping film pattern 142a together with the protruding portion of the insulating layer liner 142b.

Figure 14:
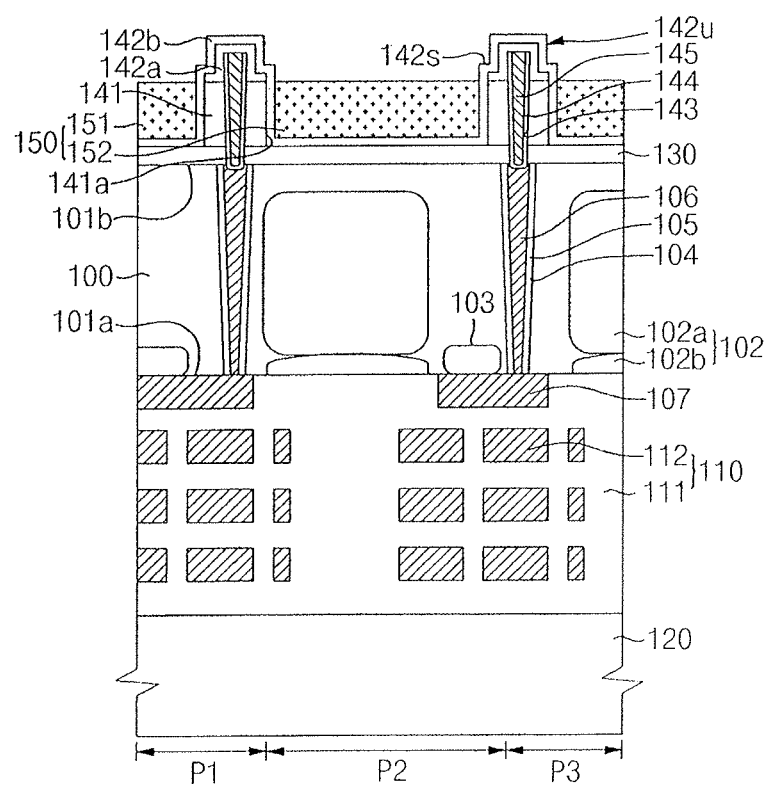

Referring to FIG. 14, the color filter 150 may be formed in the opening 141a. The color filter 150 may be formed on the insulating layer liner 142b in the opening 141a. An upper surface of the color filter 150 may be formed at the same level as, or at a lower level than, the upper surface 142s of the insulating layer liner 142b, i.e., the lower layer 142l. Thus, as the trench to receive the color filter 150 is defined by the upper surface 142s, which is lower than the upper surface of the upper contact via 145, no further processing, e.g., etching, on the color filter 150 is needed, allowing uniform distribution and controlled surface roughness.

Figure 16:
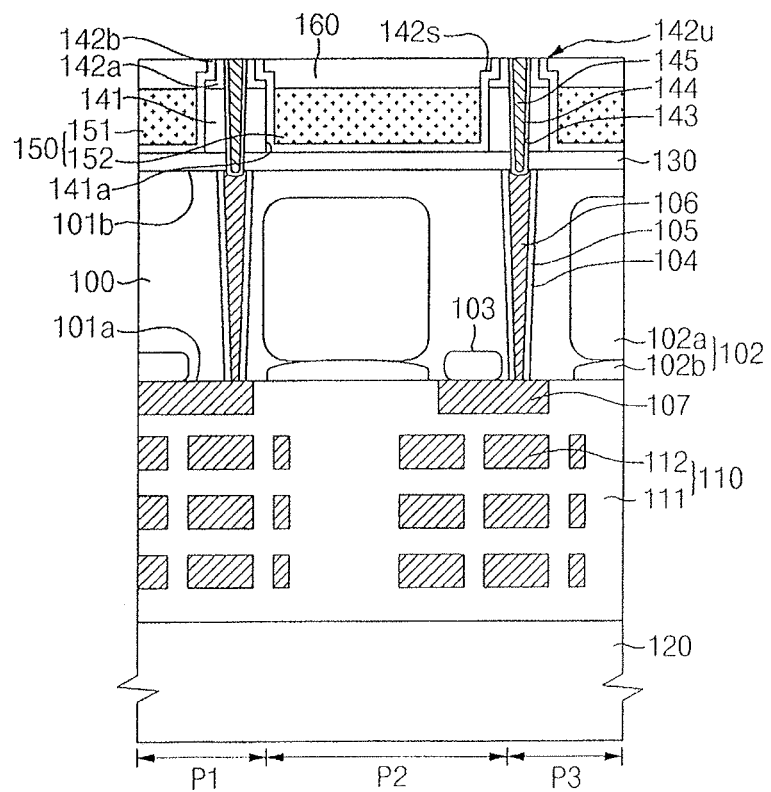

Referring to FIGS. 15 and 16, the protective film 160 that covers the upper surface of the color filter 150 may be formed. The protective film 160 may cover the color filter 150 and the insulating layer liner 142*b*. The protective film 160 may be thick enough such that sidewalls of the protrusion 160*b* of the protective film 160 that covers the stepped structure of the protruding portion including the insulating layer 140 and the upper contact via 145 are straight. Subsequently, a planarization process may be performed so that upper surfaces of the protective film 160, the insulating layer liner 142*b*, the capping film pattern 142*a*, the anti-diffusion film 144, and the upper contact via 145 are at the same level. The upper surface of the upper contact via 145 may be exposed. For example, a CMP process may be used as the planarization process.

Figure 17:
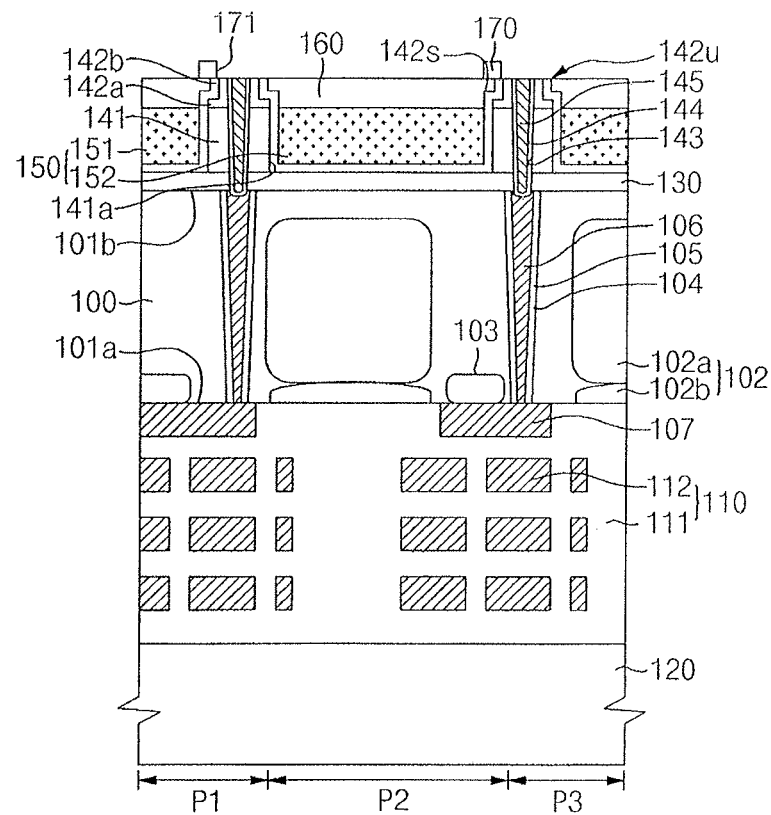

Referring to FIG. 17, a separation pattern 170 may be formed on the protective film 160. A separation layer may be formed on the protective film 160, and the separation pattern 170 may be formed by etching back the separation layer. The separation pattern 170 may have a separated space 171 exposing the protective film 160 on a bottom surface of the separation pattern 170. The separation pattern 170 may be made of an oxide.

Figure 18:
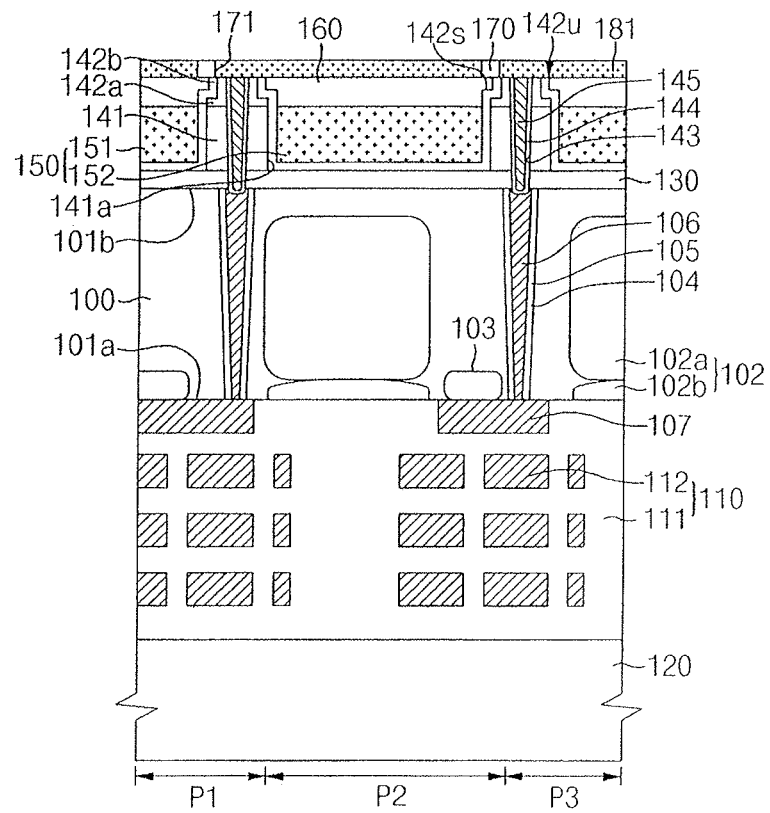

Referring to FIG. 18, the first transparent electrode 181 may fill the separated space 171. Then a planarization process may be performed, so that upper surfaces of the separation pattern 170 and the first transparent electrode 181 are at the same level. For example, a CMP process may be used as the planarization process.

Subsequently, referring back to FIG. 1, the organic photoelectric layer 182 may be formed on the first transparent electrode 181. The organic photoelectric layer 182 may have a thickness adapted to effectively improve photoelectric conversion efficiency by effectively absorbing light and separately transferring holes and electrons.

The second transparent electrode 183 may be formed on the organic photoelectric layer 182. The organic photoelectric layer 182 and the second transparent electrode 183 may be integrally formed over the first to third pixel regions.

The microlens 185 corresponding to the color filter 150 may be formed on the upper transparent electrode. According to an embodiment, a protective layer 184 may be formed between the microlens 185 and the second transparent electrode 183.

The image sensor shown in FIG. 2 may be formed using the method described with reference to FIGS. 7 to 18.

According to an embodiment, by providing a trench of appropriate height for a color filter of an image sensor, the color filter may be formed to have an improved distribution and controlled surface roughness.

Although corresponding plan views and/or perspective views of some cross-sectional view(s) may not be shown, the cross-sectional view(s) of image sensors illustrated herein provide support for a plurality of image sensors that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of image sensors may be integrated in a same electronic device. For example, when an image sensor is illustrated in a cross-sectional view, an electronic device may include a plurality of the image sensors, as would be illustrated by a plan view of the electronic device. The plurality of image sensors may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
 a substrate including a plurality of pixel regions in which photoelectric-conversion devices and storage node regions spaced apart from the photoelectric-conversion devices are formed;
 a lower contact via between the photoelectric-conversion devices in the plurality of pixel regions;
 a first insulating layer on the lower contact via and having an opening;
 an upper contact via electrically connected to the lower contact via and protruding from upper and lower portions of the first insulating layer through the first insulating layer;
 a second insulating layer that surrounds the first insulating layer and the upper contact via, an upper surface of the second insulating layer in the opening defining a trench;
 a color filter formed on the second insulating layer in the trench;
 a protective film that covers the color filter and expose an upper surface of the upper contact via;
 a first transparent electrode on the protective film and in contact with the upper contact via;
 an organic photoelectric layer on the first transparent electrode; and
 a second transparent electrode on the organic photoelectric layer.

2. The image sensor as claimed in claim 1, further comprising an anti-diffusion film surrounding a side surface and a bottom surface of the upper contact via,
 wherein the anti-diffusion film includes a part protruding from the upper and lower portions of the first insulating layer through the first insulating layer.

3. The image sensor as claimed in claim 2, wherein the second insulating layer covers an upper surface of the first insulating layer and also covers the part protruding from the upper portion of the first insulating layer in a side surface of the anti-diffusion film.

4. The image sensor as claimed in claim 1, wherein the second insulating layer has a protrusion protruding from the upper surface of the second insulating layer in the opening.

5. The image sensor as claimed in claim 1, wherein the second insulating layer has a greater thickness in a part covering an upper surface of the first insulating layer than that in the opening.

6. The image sensor as claimed in claim 1, wherein the color filter has an upper surface at or below the upper surface of the second insulating layer in the opening.

7. The image sensor as claimed in claim 1, wherein the upper contact via further includes an inclined side surface with a discontinuously changing slope.

8. An image sensor, comprising:
- a substrate having a first surface and a second surface, which is opposite to the first surface, and including a plurality of pixel regions;
- color filters formed in the plurality of pixel regions on the second surface;
- a first insulating layer between the color filters;
- a second insulating layer between the first insulating layer and the color filters to surround the first insulating layer;
- an upper contact via passing through the first insulating layer and the second insulating layer;
- a protective film that covers the color filter and expose an upper surface of the upper contact via;
- a first transparent electrode on the protective film and in contact with the upper contact via;
- an organic photoelectric layer on the first transparent electrode; and
- a second transparent electrode on the organic photoelectric layer.

9. The image sensor as claimed in claim 8, wherein the second insulating layer is formed as a multi-layer structure having steps.

10. The image sensor as claimed in claim 8, wherein the second insulating layer includes a capping film pattern covering an upper surface of the first insulating layer and surrounding a portion of the upper contact via protruding from an upper portion of the first insulating layer.

11. The image sensor as claimed in claim 10, wherein the second insulating layer includes an insulating layer liner covering a side surface of the first insulating layer and the capping film pattern.

12. The image sensor as claimed in claim 8, further comprising a lower contact via that is electrically connected to the upper contact via and that passes through the substrate.

* * * * *